(12) United States Patent
Ogasawara et al.

(10) Patent No.: US 10,159,155 B2
(45) Date of Patent: Dec. 18, 2018

(54) DISPLAY DEVICE

(71) Applicant: JOLED INC., Tokyo (JP)

(72) Inventors: Shinya Ogasawara, Kanagawa (JP); Teruo Nanmoku, Tokyo (JP)

(73) Assignee: JOLED INC., Tokyo (JP)

( * ) Notice: Subject to any disclaimer, the term of this patent is extended or adjusted under 35 U.S.C. 154(b) by 18 days.

(21) Appl. No.: 15/102,326

(22) PCT Filed: Nov. 19, 2014

(86) PCT No.: PCT/JP2014/005816
§ 371 (c)(1),
(2) Date: Jun. 7, 2016

(87) PCT Pub. No.: WO2015/087498
PCT Pub. Date: Jun. 18, 2015

(65) Prior Publication Data
US 2016/0360625 A1     Dec. 8, 2016

(30) Foreign Application Priority Data

Dec. 11, 2013  (JP) ................................. 2013-256251

(51) Int. Cl.
*H05K 5/00* (2006.01)
*H05K 1/18* (2006.01)
(Continued)

(52) U.S. Cl.
CPC ....... *H05K 5/0017* (2013.01); *H05B 33/0803* (2013.01); *H05B 33/086* (2013.01);
(Continued)

(58) Field of Classification Search
CPC ............ H05K 5/0017; G02F 1/134309; G02F 2201/56; G09G 2300/0426
(Continued)

(56) References Cited

U.S. PATENT DOCUMENTS 5,822,030 A  10/1998 Uchiyama
7,074,644 B2  7/2006 Kimura
(Continued)

FOREIGN PATENT DOCUMENTS

JP  62-081797  4/1987
JP  63-296991  12/1988
(Continued)

OTHER PUBLICATIONS

Japanese Office Action in Japan Patent Application No. 2015-552304, dated Feb. 7, 2017.
(Continued)

*Primary Examiner* — Nathan Milakovich
(74) *Attorney, Agent, or Firm* — Greenblum & Bernstein, P.L.C.

(57) ABSTRACT

A display device includes: a display panel including a first curved portion that is curved; and a drive circuit board on which a circuit for driving the display panel is formed. The drive circuit board includes a second curved portion that is curved following the first curved portion, and each of a plurality of components including one of a resistor and a capacitor and mounted on the second curved portion is mounted on the drive circuit board so that a crosswise direction of the component in plan view, which is a direction perpendicular to an alignment direction of a plurality of electrodes of the component, follows a curving direction of the second curved portion.

11 Claims, 7 Drawing Sheets

(51) Int. Cl.
    *H01L 51/00*     (2006.01)
    *G02F 1/1343*     (2006.01)
    *H05B 33/08*     (2006.01)
    *G09F 9/30*     (2006.01)
    *H05K 3/34*     (2006.01)
    *G02F 1/1339*     (2006.01)
    *G02F 1/1362*     (2006.01)
    *G02F 1/1368*     (2006.01)
    *G09G 3/3225*     (2016.01)
    *G09G 3/3266*     (2016.01)
    *G09G 3/36*     (2006.01)
    *H01L 51/52*     (2006.01)

(52) U.S. Cl.
    CPC .......... *H05K 1/181* (2013.01); *G02F 1/1339* (2013.01); *G02F 1/1368* (2013.01); *G02F 1/134309* (2013.01); *G02F 1/136286* (2013.01); *G02F 2201/56* (2013.01); *G02F 2202/022* (2013.01); *G09F 9/301* (2013.01); *G09G 3/3225* (2013.01); *G09G 3/3266* (2013.01); *G09G 3/3677* (2013.01); *G09G 2300/0426* (2013.01); *G09G 2300/0452* (2013.01); *H01L 51/5237* (2013.01); *H01L 2251/5338* (2013.01); *H05K 3/3442* (2013.01); *H05K 2201/09018* (2013.01); *H05K 2201/10015* (2013.01); *H05K 2201/10022* (2013.01); *H05K 2201/10128* (2013.01); *H05K 2201/10136* (2013.01); *H05K 2201/10636* (2013.01); *H05K 2201/10651* (2013.01); *Y02P 70/611* (2015.11)

(58) Field of Classification Search
    USPC ........................................................ 361/749
    See application file for complete search history.

(56) References Cited

U.S. PATENT DOCUMENTS

| | | | |
|---|---|---|---|
| 7,348,728 B2 * | 3/2008 | Kim | H05K 3/361 |
| | | | 313/582 |
| 7,368,805 B2 * | 5/2008 | Naitoh | G02F 1/13452 |
| | | | 257/668 |
| 7,911,554 B2 * | 3/2011 | Oohira | G02B 6/0028 |
| | | | 349/150 |
| 9,713,256 B2 * | 7/2017 | Jeon | G02F 1/13452 |
| 2005/0088830 A1 * | 4/2005 | Yumoto | G02F 1/13452 |
| | | | 361/749 |
| 2005/0130344 A1 | 6/2005 | Kimura | |
| 2009/0091681 A1 | 4/2009 | Nishizawa et al. | |
| 2009/0184418 A1 * | 7/2009 | Hwang | H01L 23/49838 |
| | | | 257/737 |
| 2012/0200511 A1 * | 8/2012 | Kim | G06F 3/0412 |
| | | | 345/173 |
| 2013/0207946 A1 * | 8/2013 | Kim et al. | G09G 3/00 |
| | | | 345/204 |
| 2014/0085587 A1 * | 3/2014 | Liao | G09G 3/36 |
| | | | 349/151 |
| 2015/0043176 A1 * | 2/2015 | Ahn | H05K 1/028 |
| | | | 361/749 |

FOREIGN PATENT DOCUMENTS

| | | | |
|---|---|---|---|
| JP | 02-246450 | 10/1990 | |
| JP | 05-095073 | 12/1993 | |
| JP | 2002-043715 | 2/2002 | |
| JP | 2002-207222 | 7/2002 | |
| JP | 2004-235238 | 8/2004 | |
| JP | 2007-127962 | 5/2007 | |
| JP | 2009-086560 | 4/2009 | |
| JP | 2009-157237 | 7/2009 | |
| JP | 2013-134295 | 7/2013 | |
| WO | WO-2015087461 A1 * | 6/2015 | ........... G02F 1/1333 |

OTHER PUBLICATIONS

Search Report issued by Japan patent office in Japan Patent Application No. PCT/JP2014/005816, dated Feb. 10, 2015.
International Search Report (ISR) in International Pat. Appl. No. PCT/JP2014/005816, dated Feb. 10, 2015.

* cited by examiner

DISPLAY DEVICE

TECHNICAL FIELD

The present disclosure relates to a display device including a display panel, such as a liquid crystal panel, an organic EL panel, or a plasma panel, on which video is displayed.

BACKGROUND ART

A liquid crystal display device including a display panel having a curved display screen is conventionally known (for example, see Patent Literature (PTL) 1).

CITATION LIST

Patent Literature

[PTL 1] Japanese Unexamined Patent Application Publication No. 2009-086560

SUMMARY OF INVENTION

Technical Problem

When a display panel is curved, however, a circuit board on which a drive circuit for driving the display panel, for example, also needs to be curved following the display panel. In this manner, when the circuit board is formed into a curve, there is the risk that a circuit defect will occur.

The present disclosure is conceived in view of the current situation described above, and has as an object to provide a display device capable of reducing the occurrence of circuit defects in an electric circuit of a display device having a curved display screen.

Solution to Problem

In order to realize the aforementioned object, a display device according to the present disclosure includes: a display panel including a first curved portion that is curved; and a circuit board on which a circuit for driving the display panel is formed, wherein the circuit board includes a second curved portion that is curved following the first curved portion, and each of a plurality of components mounted on the second curved portion is mounted on the circuit board so that a crosswise direction of the component in plan view, which is a direction perpendicular to an alignment direction of a plurality of electrodes of the component, follows a curving direction of the second curved portion, the plurality of components including one of a resistor and a capacitor.

Advantageous Effects of Invention

According to this disclosure, it is possible to reduce the occurrence of circuit defects in a circuit board of a display device having a curved display screen.

DESCRIPTION OF EMBODIMENTS

Underlying Knowledge Forming the Basis of the Present Invention

The inventors found that the following problem occurs with the liquid crystal apparatus described in the "Background Art" section.

In a liquid crystal display device, making the display screen curved to have a concave shape results in a structure in which the field of view of a viewer seems to be surrounded by the display screen of the display device, and thereby making it easier for the viewer to feel immersed in the video being displayed on the display screen.

Incidentally, with a display device such as a liquid crystal display device, there is a demand to make the display device itself thin in order, for example, to avoid creating a feeling of crowdedness even in a small space or to improve freedom of placement by facilitating wall placement, etc. If the display screen is to be made curved to have a concave shape while making the display device itself thin as described above, aside from the display panel, the circuit board for driving the display panel also needs to be curved in the same manner.

When forming a curved circuit board, the circuit board is formed into a curve after components are mounted because component mounting is easier compared to when components are mounted after the circuit board is formed into a curve. In this manner, when the circuit board is formed into a curve after components are mounted, the bending stress exerted on the circuit board also affects the components. For example, since bending stress is also exerted on the components following the bending of the circuit board, there is the risk that component defects will occur. Furthermore, there is the risk that bending stress may be exerted on the portions at which the components are soldered to the circuit board, the solder portions may crack, and, consequently, an electrode of a component may become detached from the circuit board.

Accordingly, when attempting to make the conventional liquid crystal display device thin, there is the risk that circuit defects will occur.

The present disclosure was made based on such knowledge, and, as a result of keen examination, the inventors have conceived an idea regarding a display device structure for a display device having a curved display screen.

Hereinafter, an embodiment is discussed in detail with reference to drawings as necessary. However, there are instances where excessively detailed description is omitted. For example, there are instances where detailed description of well-known matter and redundant description of substantially identical structural components are omitted. This is done to avoid unnecessary verbosity in the subsequent description, facilitate understanding by a person having ordinary skill in the art.

Although a display device according to an embodiment of the present disclosure will be described below using the figures, the embodiment of the present disclosure is not limited to this embodiment.

Embodiment

Figure 1:
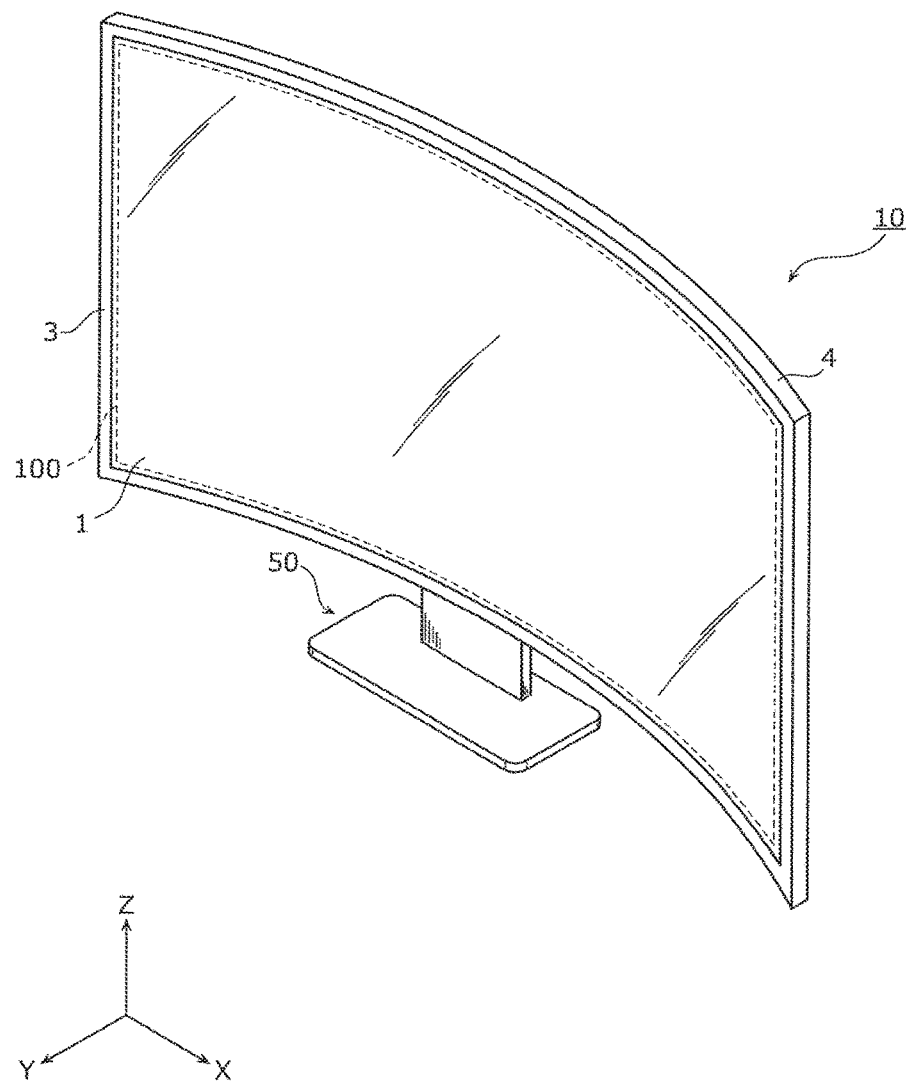
FIG. 1 is a perspective view of the external appearance of a display device according to an embodiment.
Figure 2:
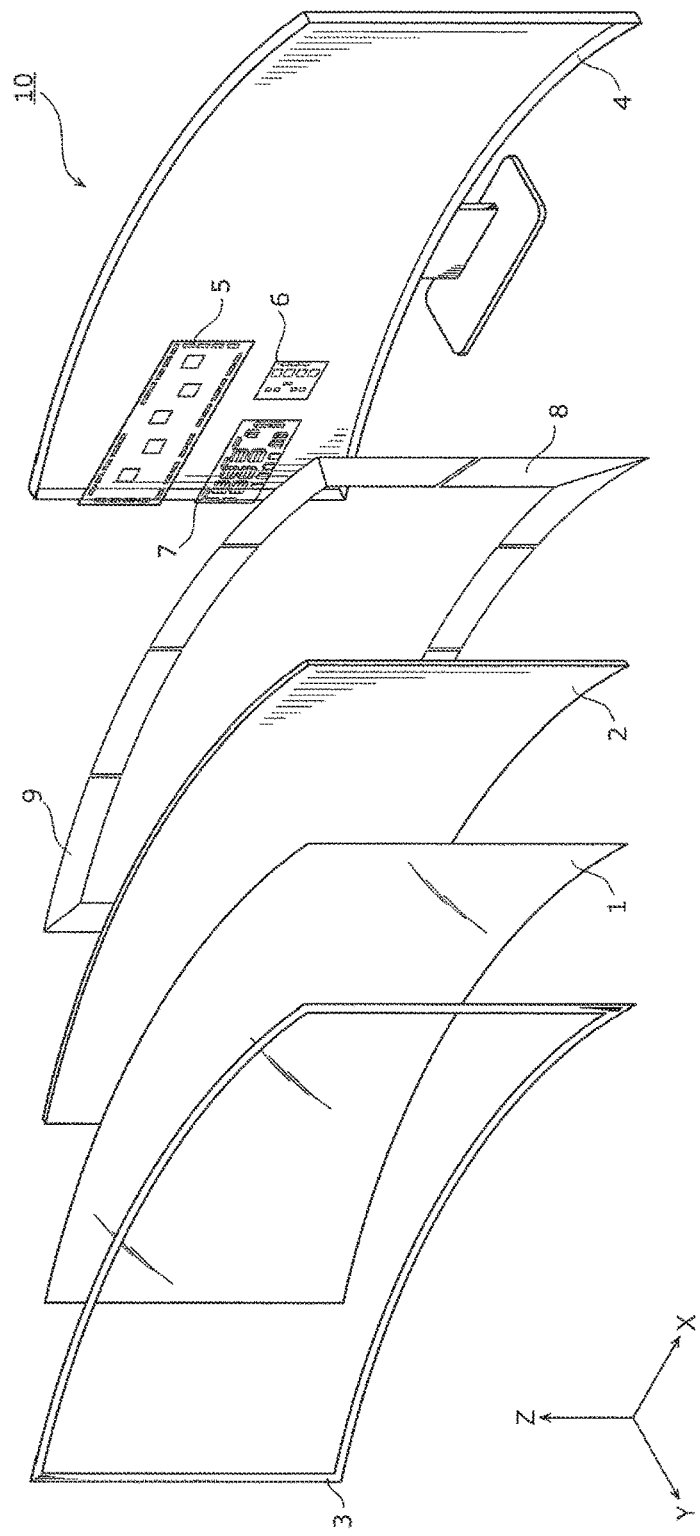
FIG. 2 is an exploded perspective view of a part of the display device according to the embodiment.
Figure 3:
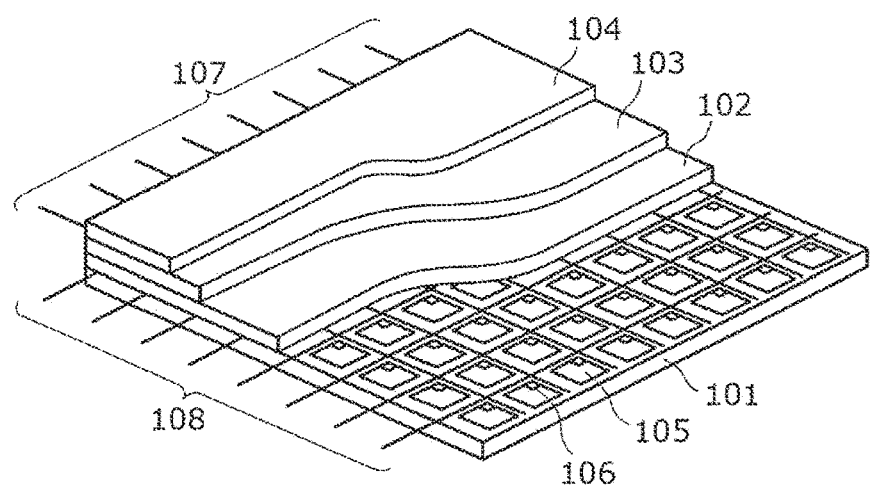
FIG. 3 is a cross-sectional view of an example of an outline structure of organic EL elements serving as RGB pixel portions in an organic EL panel included in the display device according to the embodiment.
Figure 4:
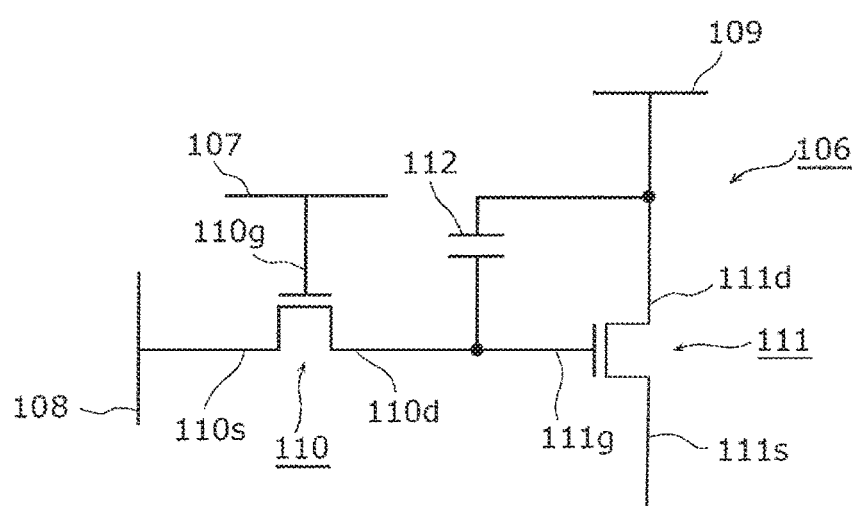
FIG. 4 is a circuit diagram illustrating an example of a circuit structure for driving an organic EL element included in the display device according to the embodiment.
Figure 5:
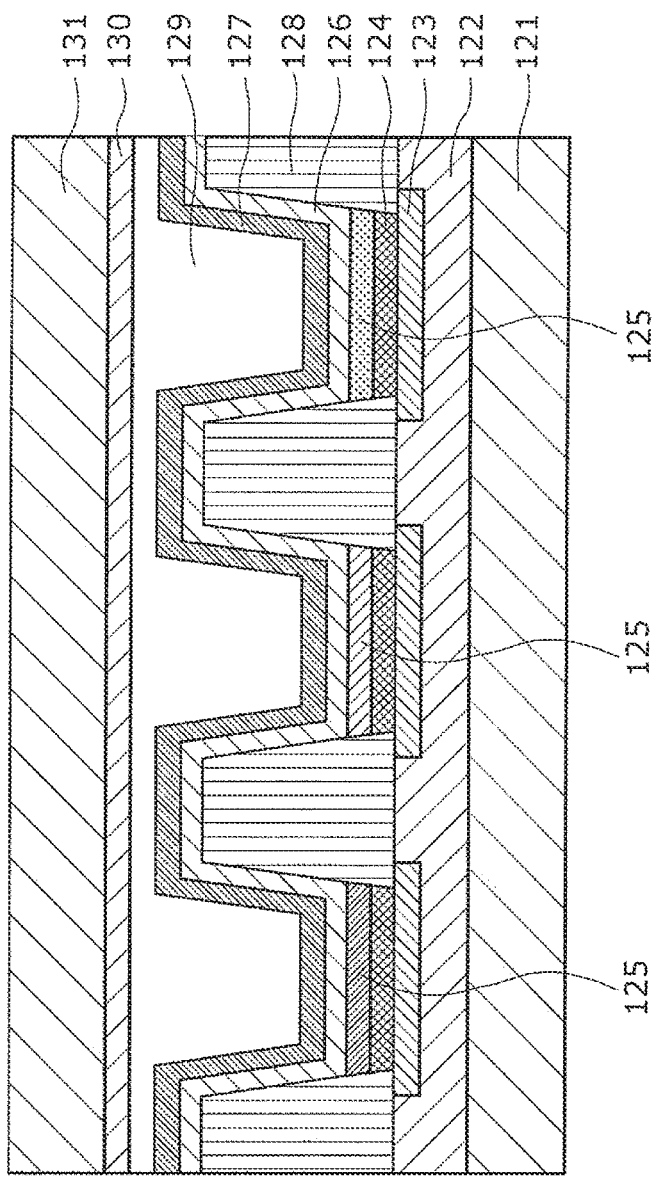
FIG. 5 is a cross-sectional view of a cross-sectional structure of a portion of RGB subpixels in the display device according to the embodiment.

FIG. 1 is a perspective view of the external appearance of a display device according to this embodiment. FIG. 2 is an exploded perspective view of a part of the display device according to this embodiment. FIG. 3 is a cross-sectional view an example of an outline structure of organic EL elements serving as an RGB pixel portion in an organic EL panel included in the display device according to this embodiment. FIG. 4 is a circuit diagram illustrating an example of a circuit structure for driving an organic EL element included in the display device according to this embodiment. FIG. 5 is a cross-sectional view of a cross-sectional structure of a portion of RGB subpixels in the display device according to this embodiment.

As illustrated in FIG. 1 and FIG. 2, a display device 10 includes a display panel 1, a chassis 2, an escutcheon frame 3, a back cover 4, circuit boards 5 to 9 of various types, and a stand 50. Hereinafter, the same reference signs are given to elements having the same function, and description is omitted.

In the display device 10, a display screen 100 of the display panel 1, which displays images, is the front side, and the side behind the display panel 1, where the circuit boards 5 to 9 are placed is the back side (non-display screen side). Specifically, for the front-back directions (Y-axis direction), the front side of the display panel 1 is set as the front, and the back side is set as the back. Hereinafter, for the sake of description, the left-right directions (X-axis direction) are defined as the left and right directions when the display device is viewed from the front side, and the up-down directions (Z-axis direction) are defined as up and down directions in the state where the display device is placed as illustrated in FIG. 1 and FIG. 2.

Organic EL Panel

As illustrated in FIG. 3 and FIG. 4, the display panel 1 included in display device 10 is an organic EL panel. The display panel 1 is configured of a stacked structure including, from the bottom-most layer, a thin-film transistor array device 101 in which a plurality of thin-film transistors are disposed, and a light-emitting unit including an anode 102 which is a bottom electrode, a light-emitting layer 103 configured from an organic material, and a cathode 104 which is a transparent top electrode. Control of the light emission by the light-emitting unit is performed by thin-film transistor array device 101. Furthermore, the light-emitting unit has a configuration in which the light-emitting layer 103 is disposed between the anode 102 and the cathode 104 which are a pair of electrodes. A hole transport layer (see subsequent description) is formed stacked between the anode 102 and the light-emitting layer 103, and an electron transport layer (see subsequent description) is formed stacked between the light-emitting layer 103 and the transparent cathode 104. A plurality of pixels 105 are arranged in a matrix in the thin-film transistor array device 101.

Each of the pixels 105 is driven by a pixel circuit 106 that is provided thereto. Furthermore, the thin-film transistor array device 101 includes, a plurality of gate lines 107 arranged in rows, source lines 108 serving as a plurality of signal lines arranged in columns to cross with gate lines 107, and a plurality of power supply 109 lines extending parallel to the source lines 108.

As illustrated in FIG. 4, the gate lines 107 are connected, on a per-row basis, to gate electrodes 110g of thin-film transistors 110 operating as switching elements included in the respective pixel circuits 106. The source lines 108 are connected, on a per-column basis, to source electrodes 110s of the thin-film transistors 110 operating as switching elements included in the respective pixel circuits 106. The power supply lines 109 are connected, on a per-column basis, to drain electrodes 111d of thin-film transistors 111 operating as driving elements included in the respective pixel circuits 106.

As illustrated in FIG. 4, each of the pixel circuits 106 includes the thin-film transistor 110 which operates as a switching element, the thin-film transistor 111 which operates as a driving element, and a capacitor 112 which stores data to be displayed by the corresponding pixel.

The thin-film transistor 110 includes the gate electrode 110g connected to the gate line 107, the source electrode 110s connected to the source line 108, a drain electrode 110d connected to the capacitor 112 and the gate electrode 111g of the thin-film transistor 111, and a semiconductor film (not illustrated). When voltage is applied to the gate line 107 and source line 108 to which the thin-film transistor 110 is connected, the voltage value of the voltage applied to the source line 108 is held in the capacitor 112 as display data.

The thin-film transistor 111 includes the gate electrode 111g connected to the drain electrode 110d of the thin-film transistor 110, the drain electrode 111d connected to the power supply line 109 and the capacitor 112, a source electrode ills connected to the anode 102, and a semiconductor film (not illustrated). The thin-film transistor 111 supplies current corresponding to the voltage value held by capacitor 112, from the power supply line 109 to the anode 102 via the source electrode 111s. Specifically, the display panel 1 of display device 10 having the above-described configuration adopts the active-matrix system which performs display control for each pixel 105 disposed at a crosspoint between the gate lines 107 and the source lines 108.

Furthermore, in the light-emitting unit in the display device 10, which emits light in at least the light-emission colors of red, green, and blue, a plurality of subpixels having at least red (R), green (G), and blue (B) light-emission layers are arranged in a matrix to form a plurality of pixels. The subpixels included in each pixel are separated from each other by banks. The banks are provided by forming projections extending parallel to the gate lines 107 and projections extending parallel to the source line 108 so as to cross each other. In addition, the subpixels having the RGB light-emission layers are formed in the portions surrounded by the projections, that is, the opening portions of the banks.

FIG. 5 is a cross-sectional view of a cross-sectional structure of a portion of RGB subpixels in the organic EL panel of the display device. As illustrated in FIG. 5, in the display panel 1, a thin-film transistor array device 122 included in each of the above-described pixel circuits 106 is formed above a base substrate 121 such as a glass substrate or a flexible resin substrate. Furthermore, an anode 123 which is a bottom electrode is formed in the thin-film transistor array device 122 via a planarizing insulating film (not illustrated). In addition, a hole transport layer 124, a light-emitting layer 125 which is made from an organic material and emits light of any one of RGB, an electron transport layer 126, and a cathode 127 which is a transparent top electrode are sequentially formed stacked above anode 123. With this, the RGB organic EL light-emitting unit is configured.

Furthermore, the light-emitting layer 125 of the light-emitting unit is formed in an area partitioned by banks 128 which are insulating layers. The banks 128 are for ensuring insulation between the anode 123 and the cathode 127 and partitioning the light-emitting area into predetermined shapes, and are configured from, for example, a photosensitive resin such as silicon oxide or polyimide.

It should be noted that, although only the hole transport layer 124 and the electron transport layer 126 are shown in the above-described embodiment, a hole injection layer and an electron injection layer are formed stacked on the hole transport layer 124 and the electron transport layer 126, respectively.

The light-emitting unit configured in the above manner is covered by a sealing layer 129 of silicon nitride, and sealed by further sticking a sealing substrate 131 such as a transparent glass substrate or transparent flexible resin substrate above the entirety of the sealing layer 129 via an adhesive layer 130.

Here, the shape, material, size, etc. of the base substrate 121 is not particularly limited, and may be selected as suitable according to the purpose. For example, a glass material such as non-alkali glass or soda glass, or a silicon substrate, or a metal substrate may be used. Furthermore, for the purpose of reducing weight or increasing flexibility, a polymer material may be used. Although polyethylene terephthalate, polycarbonate, polyethylene naphthalate, polyamide, polyimide, etc., are suitable as a polymer material, other known polymer substrate materials such as an acetate-based resin, an acrylic resin, polyethylene, polypropylene, or polyvinyl chloride resin may be used. When using a polymer material as a substrate, a fabrication method is used in which an organic EL light-emitting element is formed after a polymer substrate is formed on a rigid base material such as glass by coating, sticking, etc., and the rigid base material such as glass is subsequently removed.

The anode 123 is configured from a metal material with good conductivity such as aluminum, an aluminum alloy, or copper, etc., or a metal oxide with high electrical conductivity such as light-transmissive IZO, ITO, tin oxide, indium oxide, zinc oxide, etc., or a metal sulfide, etc. As a film-forming method, a thin-film forming method such as vacuum deposition, sputtering, or ion plating is used.

For the hole transport layer 124, a polyvinyl carbazole-based material, a polysilane-based material, a polysiloxane derivative, a phthalocyanine-based compound such as copper phthalocyanine, or an aromatic-amine-based compound, etc., is used. Various coating methods can be used as a film-forming method, and the hole transport layer 124 is formed to a thickness of approximately 10 nm to 200 nm. Furthermore, the hole injection layer that is stacked on the hole transport layer 124 is a layer for enhancing hole injection from the anode 123, and is formed by sputtering, using a metal oxide such as molybdenum oxide, vanadium oxide, aluminum oxide, etc., or a metal nitride, or a metal oxynitride.

The light-emitting layer 125 has, as a primary component, an organic material that exhibits fluorescence, phosphorescence, etc., and a dopant is added as necessary to improve characteristics. As a polymeric organic material suitable for printing methods, a polyvinyl carbazole derivative, a poly-paraphenylene derivative, a ponyphenylene vinylene derivative, etc. is used. The dopant is used to improve light-emitting wavelength shift or light-emitting efficiency, and many pigment-based and metal complex-based dopants are being developed. For example, printing is suitable when forming the light-emitting layer 125 on a large substrate, and the light-emitting layer 125 having a thickness of approximately 20 nm to 200 nm is formed by using the inkjet method out of the various printing methods.

For the electron transport layer 126, a material such as a benzoquinone derivative, a polyquinoline derivative, or an oxadiazole derivative is used. Vacuum deposition, coating, etc., is used as a film-forming method, and the electron transport layer 126 is normally formed to a thickness of approximately 10 nm to 200 nm. Furthermore, the electron injection layer is formed by vacuum deposition, coating, etc., using a material such as barium, phthalocyanine, or lithium fluoride.

The material of the cathode 127 differs depending on the light extraction method, and, when light is extracted from the cathode 127 side, a light-transmissive conductive material such as ITO, IZO, tin oxide, or zinc oxide is used. When light is extracted from the anode 123 side, a material such as platinum, gold, silver, copper, tungsten, aluminum, or an aluminum alloy is used. Sputtering, vacuum deposition, etc., is used as a film-forming method, and the cathode 127 is formed to a thickness of approximately 50 nm to 500 nm.

The banks 128 are structures necessary for filling a sufficient amount of a solution including the material of the light-emitting layer 125 into an area, and are formed in a predetermined shape by photolithography. By forming the banks 128, the shape of the subpixels of the organic EL light-transmitting unit can be controlled.

The sealing layer 129 is formed by forming a silicon nitride, and chemical vapor deposition (CVD) is used as a film-forming method.

Circuit Boards

Electric circuit boards 5 to 7 drive the display panel 1 by transmitting an electrical signal to the display panel 1 based on image data indicating an image, and, in this embodiment, are electrically connected to a plurality of drive circuit boards 8 and a plurality of drive circuit boards 9 of display panel 1. The electric circuits of the respective electric circuit boards 5 to 7 are, for example, a signal processing circuit that process a received video signal, a control circuit that controls the operation of a scanning drive circuit and a signal drive circuit, or a power supply circuit that receives power from the outside and supplies the power to respective circuits, etc.

As illustrated in FIG. 2, all of the electric circuit boards 5 to 7 are board-shaped and attached to a boss (not illustrated) provided behind the chassis 2 using a screw, etc. Accordingly, each of the electric circuit boards 5 to 7 opposes the display panel 1 in a separated state. Specifically, the chassis 2 which supports the back face of the display panel 1 holds the electric circuit boards 5 to 7, with a space separating the electric circuit boards 5 to 7 and the chassis 2.

Furthermore, the drive circuit boards 8 are boards having scanning drive circuits that supply scanning drive signals to the display panel 1, via each of a plurality of scanning lines that are not illustrated in the figure. Furthermore, the drive circuit boards 9 are boards having signal line drive circuits that supply signal voltages to the display panel 1, via each of a plurality of signal lines that are not illustrated in the figure. It should be noted that the scanning drive circuit is also called a gate driver, a scan driver, etc., and the signal line drive circuit is also called a data driver, source driver, etc.

Each of the drive circuit boards 8 and the drive circuit boards 9 are connected to the display panel 1 by a flexible cable having the scanning lines or the signal lines. Furthermore, the flexible cables connected to the drive circuit boards 8 (9) are folded back over the outer portion of the chassis 2 and inward, and, in this state, the drive circuit boards 8 (9) are fixed to the edges of the chassis 2 which is joined to the back face of the display panel 1. In other words, the display panel 1 is electrically connected to the drive circuit boards 8 (9), and is disposed on a side of the chassis 2 that is opposite the side on which the drive circuit boards 8 (9) are disposed.

The drive circuit boards 8 are rectangular board-like members, and are disposed with the lengthwise direction arranged along the Z-axis direction. More specifically, behind the display panel 1 (in this embodiment, further behind the chassis 2 as described above), two of the drive circuit boards 8 are disposed aligned in the Z-axis direction, at each of the two X-axis direction edges of the display panel 1. It should be noted that the number of the drive circuit boards 8 is not limited to that described above.

The drive circuit boards 9 are rectangular board-like members like the driving circuits 8, and are disposed with the lengthwise direction arranged along the X-axis direction. More specifically, behind the display panel 1 (in this embodiment, further behind the chassis 2 as described above), four of the drive circuit boards 8 are disposed aligned in the X-axis direction, at each of the two Z-axis direction edges of the display panel 1. It should be noted that the number of the drive circuit boards 9 is not limited to that described above.

Incidentally, as illustrated in FIG. 2, the entirety of the display panel 1 is curved along the X-axis direction. In other words, it can also be said that the display panel 1 includes a first curved portion that is curved.

As described above, when placing the drive circuit boards 9, the drive circuit boards 9 to be placed further behind the display panel 1 and the chassis 2 also need to be curved because the display panel 1 and the chassis 2 are curved along the X-axis direction. This will be described using FIG. 6.

Figure 6:
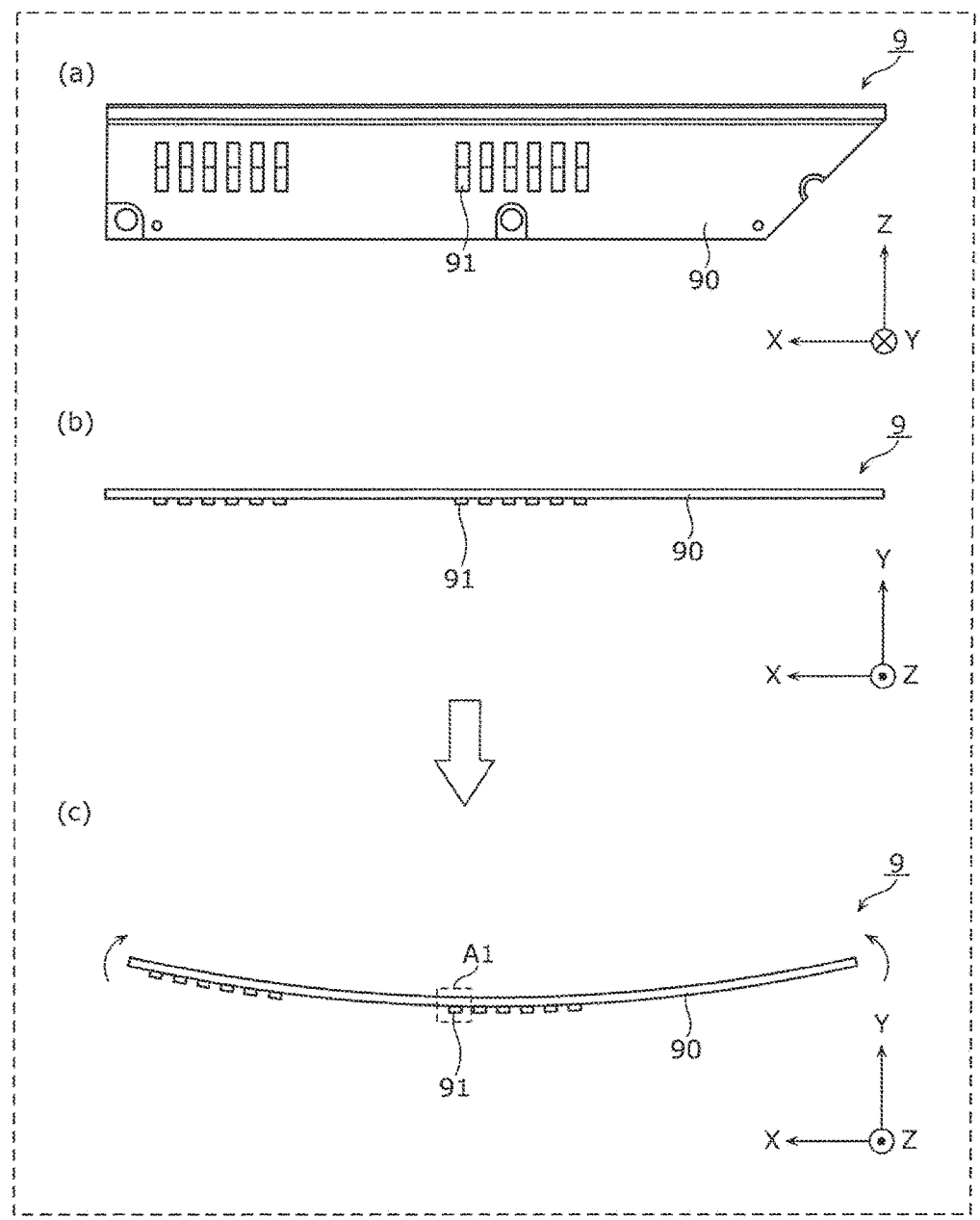
FIG. 6 illustrates a back view of one drive circuit board among the plurality of drive circuit boards as viewed from the back side, a top view of the drive circuit board as viewed from the top side, and a top view when the drive circuit board is made to curve.

FIG. 6 illustrates a back view of one drive circuit board among the plurality of drive circuit boards as viewed from the back side, a top view of the drive circuit board as viewed from the top side, and a top view when the drive circuit board is made to curve.

As illustrated in the front view in (a) in FIG. 6, the drive circuit board 9 has a lengthwise direction that coincides with the X-axis direction, and a crosswise direction that coincides with the Z-axis direction. A plurality of components 91 are mounted on the drive circuit board 9. The components 91 are components including a resistor or a capacitor. The components 91 are surface mounted devices (SMDs) in this embodiment.

As illustrated in the top views in (b) and (c) in FIG. 6, the components 91 mounted on drive circuit board 9 are surface-mounted on the back face of a board 90. As described above, since the drive circuit board 9 needs to be curved along the direction in which the display panel 1 curves, the drive circuit board 9 is bent from the flat board state illustrated in (b) in FIG. 6 to the curved board state illustrated in (c) in FIG. 6. As illustrated in FIG. 2 and FIG. 6, the drive circuit board 9 is disposed in the curved state, behind the display panel 1 and chassis 2. Thus, it can also be said that the drive circuit board 9 has a second curved portion that is curved following the first curved portion of the display panel 1. Furthermore, it can also be said that the drive circuit board 9 is disposed behind the display panel 1 (i.e. on the side of the display panel 1 that is opposite the display screen side), so that the second curved portion of the drive circuit board 9 overlaps the first curved portion of the display panel 1 at a position corresponding to the first curved portion.

Figure 7:
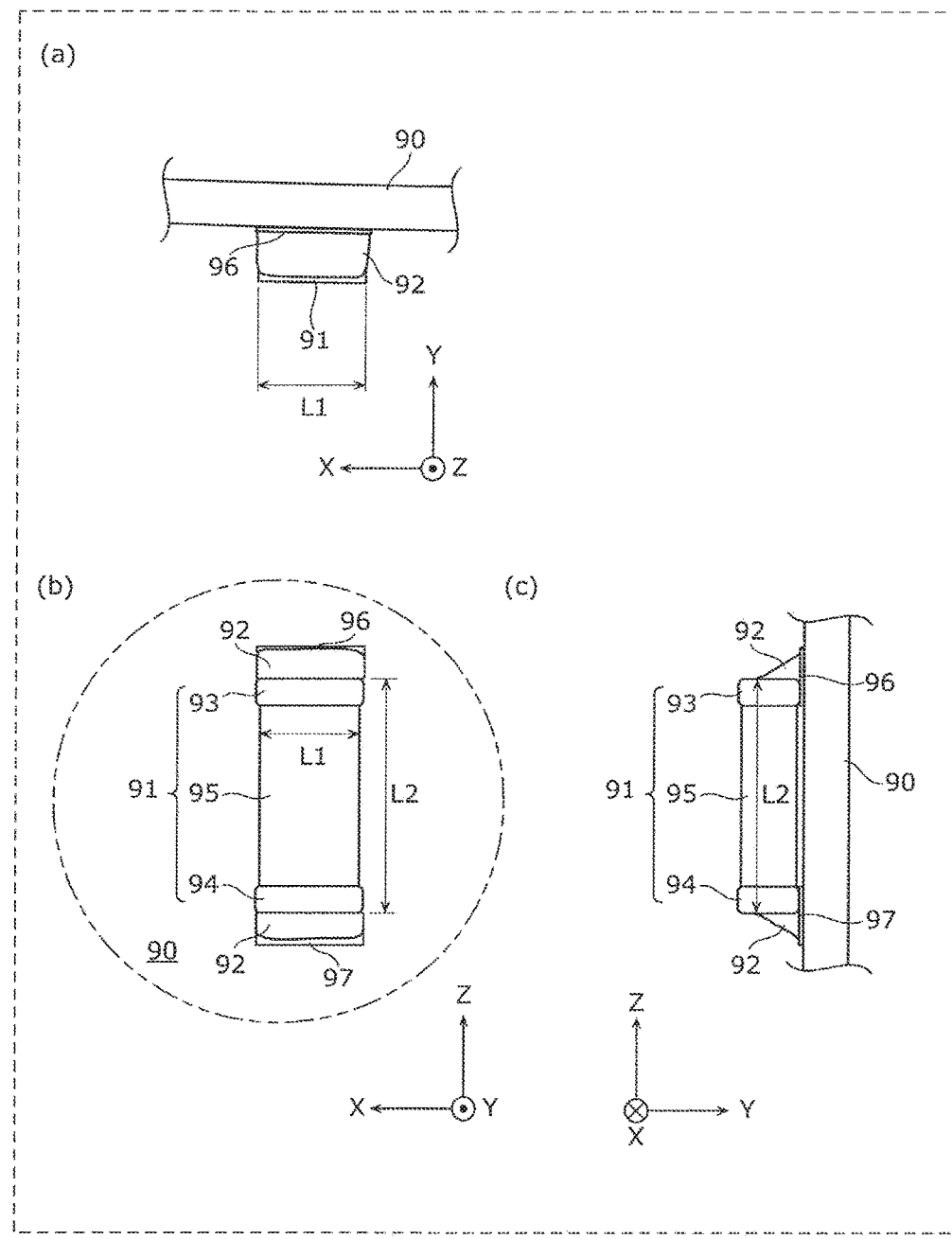
FIG. 7 illustrates enlarged views of a component in area A1 in (c) in FIG. 6 out of components mounted on the drive circuit board.

FIG. 7 illustrates enlarged views of the component in area A1 in (c) in FIG. 6 out of the components mounted on the drive circuit board. More specifically, in FIG. 7, (a) is an enlarged view of the component 91 that is surface-mounted on the board 90, as viewed from the Z-axis direction. In FIG. 7, (b) is an enlarged view of the component 91 that is surface-mounted on the board 90, as viewed from the Y-axis direction. In FIG. 7, (c) is an enlarged view of the component 91 that is surface-mounted on the board 90, as viewed from the X-axis direction.

As illustrated in FIG. 7, the component 91 is includes a plurality of electrodes 93 and 94, and a chip 95 which makes up the body of the component. Each of the electrodes 93 and 94 are electrically and mechanically connected to wires 96 and 97 formed on the surface of the board 90, by soldering. Specifically, with regard to the component 91, the electrodes 93 and 94 and the wires 96 and 97 are electrically and mechanically connected by solder portions 92.

Here, as illustrated in FIG. 7, the component 91 is of a shape in which a second width L2 in the Z-axis direction is greater than a first width L1 in the X-axis direction. In other words, the component 91 is a rectangular component in plan view, and is mounted on the drive circuit board 9 so that its crosswise direction follows the direction in which the drive circuit board 9 curves.

Furthermore, the component 91 is mounted on the drive circuit board 9, with the electrodes 93 and 94 aligned in the Z-axis direction and the chip 95 disposed therebetween. In other words, the component 91 is mounted on the drive circuit board 9 so that a direction perpendicular to the alignment direction of the electrodes 93 and 94 follows the direction in which the drive circuit board 9 curves.

Furthermore, the components 91 are included in a drive circuit formed on the drive circuit board 9. Specifically, the components 91 are components electrically connected to the drive circuit of the drive circuit board 9 and function as at least a part of the drive circuit. Stated differently, the components 91 do not include a dummy component which is disposed on the drive circuit board 9 and does not function as at least a part of the drive circuit. In short, even when a dummy component is rectangular in plan view and the crosswise direction of the dummy component does not follow the direction in which the drive circuit board 9 curves, the dummy component is within the scope of structural components of the present disclosure.

Characteristic Features

In the display device 10 according to this embodiment, the drive circuit board 9, which is disposed behind the display panel 1 which is curved along the X-axis direction, is curved following the display panel 1. In addition, each of the components 91 including a resistor or a capacitor and mounted on the drive circuit board 9 is mounted on the drive circuit board 9 so that the crosswise direction of the component 91, which is a direction perpendicular to the alignment direction of the electrodes 93 and 94 of the component 91, follows the direction in which the drive circuit board 9 curves.

Because the drive circuit board 9 is curved in the X-axis direction, a positional deviation in the Y-axis direction occurs between an arbitrary first position in the drive circuit board 9 and a second position that is shifted from the first position in the X-axis direction. The positional shift in the Y-axis direction that occurs because the drive circuit board 9 is curved increases as the distance between the first and second positions in the X-axis direction increases. In other words, the shift in the Y-axis direction between the first position and a third position having a distance from the first position in the X-axis direction that is greater than that of the second position is greater than the deviation in the Y-axis direction between the first position and the second position. As such, when the drive circuit board 9 is made to curve, the bending stress exerted on the chip 95 of the component 91 and the bending stress exerted on the solder portions 92 at which the component 91 is electrically and mechanically connected to the board 90 can be reduced compared to when the component 91 is mounted on the drive circuit board 9 so that the lengthwise direction of the component 91 or the alignment direction of the electrodes 93 and 94 of the component 91 follow the direction in which the drive circuit board 9 curves. Therefore, the negative effects of bending stress on the chip 95 of the component and on the solder portions 92 can be reduced, and thus the occurrence of defects in the component 91 or the occurrence of cracks in the solder portions 92 and, consequentially, detachment of an electrode of the component from the circuit board can be prevented. Accordingly, it is possible to reduce the occurrence of circuit defects in the circuit board due to the curving of the display panel of the display device.

Modifications (1)

Figure 8:
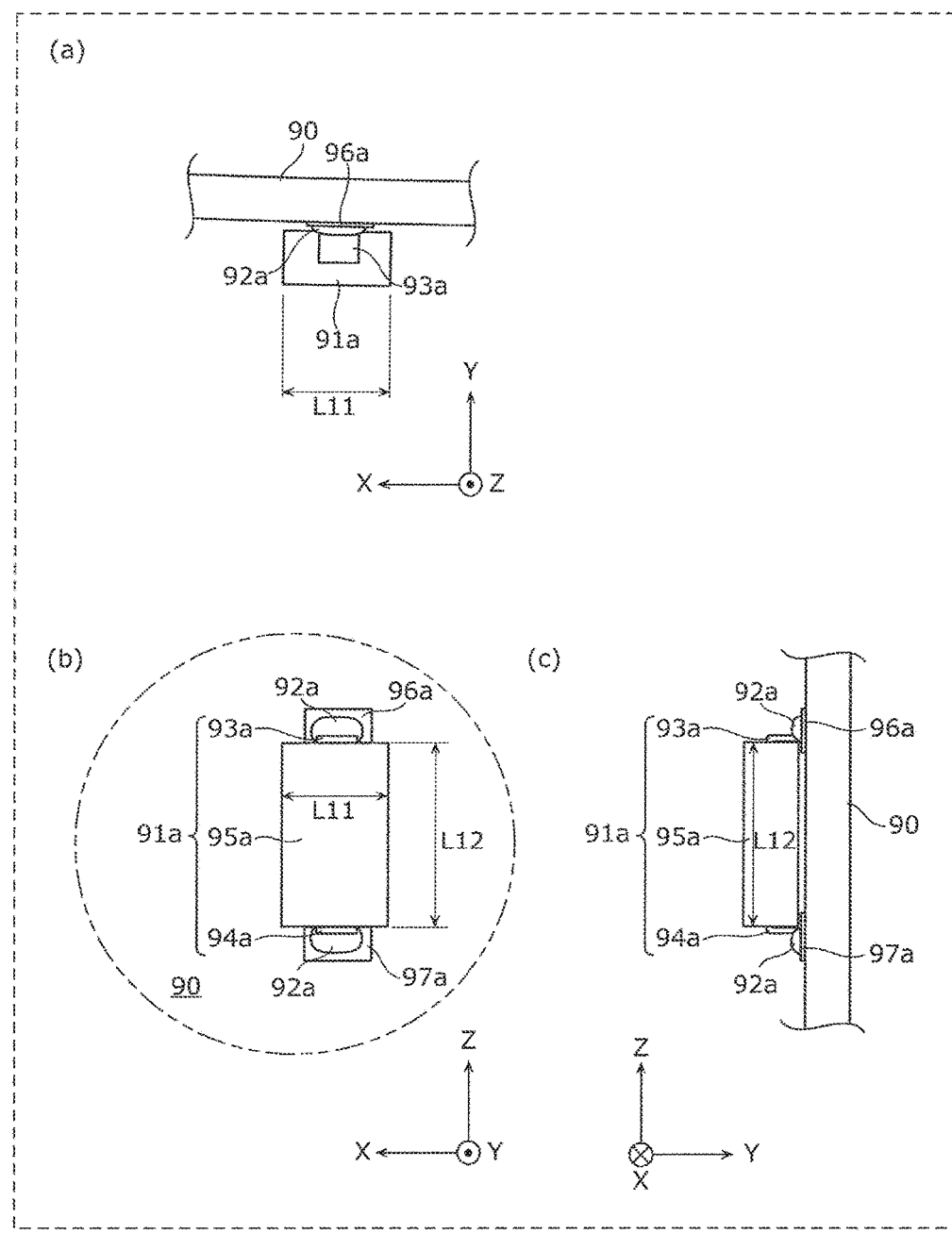
FIG. 8 is an enlarged view of a component 91*a* which is mounted on the drive circuit board and is of a type different from a component 91.

The foregoing embodiment is not limited to the component 91 having a structure in which the electrodes 93 and 94 cover both ends of the outer packaging of the chip 95 as illustrated in FIG. 7, and the component 91 may have a structure in which electrodes 93a and 94a are exposed from the inside of a chip 95a making up the body of the component as illustrated in FIG. 8.

FIG. 8 is an enlarged view of a component 91a which is mounted on the drive circuit board and is of a type different from the component 91. More specifically, in FIG. 8, (a) is an enlarged view of the component 91a that is surface-mounted on the board 90, as viewed from the Z-axis direction. In FIG. 8, (b) is an enlarged view of the component 91a that is surface-mounted on the board 90, as viewed from the Y-axis direction. In FIG. 8, (c) is an enlarged view of the component 91a that is surface-mounted on the board 90, as viewed from the X-axis direction.

As illustrated in FIG. 8, the component 91a includes a plurality of electrodes 93a and 94a, and a chip 95a. Each of the electrodes 93a and 94a has one end which is connected to one or the other of electrodes of the element itself inside the chip 95a, and another end which is exposed to the outside of the chip 95a. Each of the electrodes 93a and 94a are electrically and mechanically connected, by soldering, to wires 96a and 97a formed on the surface of the board 90. Specifically, with regard to the component 91a, the electrodes 93a and 94a and the wires 96a and 97a are electrically and mechanically connected by solder portions 92a.

Here, as illustrated in FIG. 8, the component 91a has a shape in which a second width L12 in the Z-axis direction is greater than a first width L11 in the X-axis direction. In other words, the component 91a is a rectangular component in plan view, and is mounted on the drive circuit board 9 so that its crosswise direction follows the direction in which the drive circuit board 9 curves.

Furthermore, the component 91a is mounted on the drive circuit board 9, with the electrodes 93a and 94a aligned in the Z-axis direction and the chip 95a disposed therebetween. In other words, the component 91a is a rectangular component in plan view, and is mounted on the drive circuit board 9 so that its crosswise direction follows the direction in which the drive circuit board 9 curves.

(2)

Furthermore, although in the display device 10 according to the foregoing embodiment, the display panel 1 is curved along the X-axis direction throughout its entire X-axis direction-width, the present disclosure is not limited to such. For example, the configuration of the present disclosure may be applied to a display device including a display panel having a portion that is curved and the rest of portions that are not curved. In other words, the display panel 1 includes a first curved portion having a portion that is curved. In addition, a drive circuit board for driving the display panel has a second curved portion that is curved following the first curved portion. The drive circuit board need not be curved at a portion that is behind the display panel and other than the first curved portion. Even in a display panel having a portion that is curved such as that described above, each of components including a resistor or a capacitor and mounted on the second curved portion of the drive circuit board may be mounted on the drive circuit board so that the crosswise direction of the component in plan view, which is a direction perpendicular to the alignment direction of the electrodes of the component, follows the curving direction of the second curved portion.

(3)

Furthermore, although in the display device 10 according to the foregoing embodiment, the display panel 1 is curved along the X-axis direction, the display panel 1 is not limited to such configuration. For example, the display panel may be curved along the Z-axis direction. Even in this case, the configuration of the present disclosure can be applied by reading the term X-axis direction in the foregoing embodiment as Z-axis direction instead so that the circuit board disposed behind the display panel becomes curved along the Z-axis direction.

(4)

Furthermore, although in the display device 10 according to the foregoing embodiment, the display panel 1 is curved so that the display screen is a concave curved face, the display panel 1 is not limited to such configuration. Even when the display panel is curved so that the display screen is a convex curved face, the configuration in the present disclosure can be applied because the drive circuit board disposed behind the display panel is made to curve.

(5)

Furthermore, although in the display device 10 according to the foregoing embodiment, a component to be mounted on the drive circuit board 9 is mounted on the drive circuit board 9 so that the crosswise direction of the component follows the curving direction of the drive circuit board 9, this configuration is not limited to the drive circuit board 9. For example, when the electric circuit boards 5 to 7 are curved, component to be mounted on the electric circuit boards 5 to 7 may likewise be mounted on the electric circuit boards 5 to 7 so that the crosswise direction of the components follow the curving direction of the electric circuit boards 5 to 7.

(6)

Furthermore, although in the display device 10 according to the foregoing embodiment, the components 91 are surface-mounted on the back face of board 90, components may be surface-mounted on the front face. Furthermore, components are not limited to being surface-mounted on the board, and may be through-hole mounted. Furthermore, surface-mounting on the front face of the board, surface-mounting on the back face of the board, and through-hole mounting may be combined. It should be noted that, since the strength of the mechanical connection to the board is weaker for surface-mounting of components than for through-hole mounting, applying the configuration in the present disclosure to surface-mounting of components makes it possible to remarkably obtain the advantageous effect of the present disclosure of preventing the reduction of mechanical strength.

(7)

Furthermore, although in the display device 10 according to the foregoing embodiment, the components 91 mounted on the drive circuit board 9 are resistors or capacitors, aside from these, the components may further include a connector for connecting the drive circuit and another circuit formed on another circuit board different from the drive circuit board 9. It should be noted that the drive circuit board 9 in this case is one drive circuit board 9 out of the plurality of drive circuit boards 9, and the other circuit board may be the circuit boards 5 to 8 other than the drive circuit board 9, or may be another drive circuit board 9 different from the one drive circuit board 9, or may be the display panel 1, or may be yet another circuit board.

(8)

Furthermore, although in the display device 10 according to the foregoing embodiment, an organic EL panel is adopted for the display panel 1, the display panel is not limited to such, and may be a liquid crystal panel or a plasma panel.

INDUSTRIAL APPLICABILITY

The present disclosure is useful as an organic EL display device, a liquid crystal display device, a plasma display device, etc., capable of reducing the occurrence of circuit defects in a circuit board of a display device having a curved display screen.

REFERENCE SIGNS LIST

1 display panel
2 chassis
3 escutcheon frame
4 back cover
5-7 electric circuit board
8, 9 drive circuit board
10 display device
50 stand
90 board
91, 91*a* component
92, 92*a* solder portion
93, 93*a*, 94, 94*a* electrode
95, 95*a* chip
96, 96*a*, 97, 97*a* wire
100 display screen
101 thin-film transistor array device
102 anode
103 light-emitting layer
104 cathode
105 pixel
106 pixel circuit
107 gate line
108 source line
109 power supply line
110 thin-film transistor
110*d* drain electrode
110*s* source electrode
111 thin-film transistor
111*d* drain electrode
111*s* source electrode
112 capacitor
121 base substrate
122 thin-film transistor array device
123 anode
124 hole transport layer
125 light-emitting layer
126 electron transport layer
127 cathode
128 bank
129 sealing layer
130 adhesive layer
131 sealing substrate
L1, L11 first width
L2, L12 second width

The invention claimed is:

1. A display device comprising:
   a display panel including a first curved portion curved in a direction of a curvature; and
   a plurality of drive circuit boards, each of the drive boards having a circuit configured to drive the display panel,
   wherein each of the plurality of the drive circuit boards
      includes a second curved portion that follows the curvature of the first curved portion, and
      includes a plurality of components disposed thereon, the plurality of the components arranged in the direction of the curvature,
   wherein each of the components includes a first electrode, a second electrode, and a chip,
   wherein the first electrode, the second electrode and the chip are aligned in a direction perpendicular to the direction of the curvature,
   wherein the chip is disposed between the first electrode and the second electrode,
   wherein the plurality of the drive circuit boards are arranged on four sides of the display panel,
   wherein each of the plurality of the drive circuit boards includes multiples of the chip arranged in a row direction in an array, and
   wherein the multiples of the chip arranged in the row direction in the array matches a curvature of the first curved portion of the display panel.

2. The display device according to claim 1,
   wherein, for each of the plurality of drive circuit boards, the plurality of components is mounted on a surface of a respective drive circuit board so that an alignment direction of a plurality of connection portions to which each of the components is soldered follows the direction perpendicular to the direction of the curvature.

3. The display device according to claim 1,
   wherein each of the drive circuit boards is disposed on a side of the display panel that is opposite a display screen side of the display panel, so that the second curved portion of each of the drive circuit boards overlaps the first curved portion at a position corresponding to the first curved portion.

4. The display device according to claim 1,
wherein, for each of the plurality of drive circuit boards, the plurality of components is included in the circuit.

5. The display device according to claim 1,
wherein, for each of the plurality of drive circuit boards, in each drive board including the chip, one end of the first electrode contacts a first end of the chip, and one end of the second electrode contacts a second end of the chip.

6. The display device according to claim 1,
wherein each of the plurality of components is a surface mount device (SMD).

7. The display device according to claim 1,
wherein the plurality of the drive circuit boards are arranged at a perimeter of the display panel.

8. The display device according to claim 1,
wherein the plurality of the drive circuit boards includes
a first set of drive circuit boards arranged along the direction of the curvature, and
a second set of drive circuit boards arranged along the direction perpendicular to the direction of the curvature.

9. The display device according to claim 1,
wherein each of the plurality of the drive circuit boards is a rectangular board.

10. The display device according to claim 1,
wherein each of the plurality of the drive circuit boards disposed in the row direction of the display panel is bent to match a curvature of the first curved portion of the display panel.

11. The display device according to claim 1,
wherein two of the plurality of the drive circuit boards are disposed to meet at a corner of the display panel.

* * * * *